(12) United States Patent
Song

(10) Patent No.: US 9,136,359 B2
(45) Date of Patent: Sep. 15, 2015

(54) THREE-DIMENSIONAL FLASH MEMORY USING FRINGING EFFECT AND METHOD FOR MANUFACTURING

(75) Inventor: Yun Heub Song, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 14/125,853

(22) PCT Filed: Jun. 13, 2012

(86) PCT No.: PCT/KR2012/004639
§ 371 (c)(1),
(2), (4) Date: Dec. 12, 2013

(87) PCT Pub. No.: WO2012/173380
PCT Pub. Date: Dec. 20, 2012

(65) Prior Publication Data
US 2014/0110775 A1    Apr. 24, 2014

(30) Foreign Application Priority Data

Jun. 13, 2011  (KR) ................. 10-2011-0056947

(51) Int. Cl.
*H01L 29/792* (2006.01)
*H01L 27/115* (2006.01)
*H01L 29/66* (2006.01)

(52) U.S. Cl.
CPC .... *H01L 29/66833* (2013.01); *H01L 27/11582* (2013.01); *H01L 29/7926* (2013.01)

(58) Field of Classification Search
CPC ...... H01L 29/792; H01L 27/115; H01L 29/66
USPC ......................................................... 257/325
See application file for complete search history.

(56) References Cited

U.S. PATENT DOCUMENTS

| 2010/0200904 | A1* | 8/2010 | Suh et al. ............... 257/324 |
| 2014/0264549 | A1* | 9/2014 | Lee ........................ 257/324 |

FOREIGN PATENT DOCUMENTS

| KR | 1020080011337 A | 2/2008 |
| KR | 1020090094928 A | 10/2009 |

(Continued)

OTHER PUBLICATIONS

Ryota Katsumata, et al; "Pipe-shaped BiCS Flash Memory with 16 Stacked Layers and Multi-Level-Cell-Operation for Ultra High Density Storage Devices", 2009 Symposium on VLSI Technology; Jun. 16-18, 2009; pp. 136-137.

(Continued)

*Primary Examiner* — Marc Armand
(74) *Attorney, Agent, or Firm* — Ladas & Parry LLP

(57) ABSTRACT

Provided are a three-dimensional flash memory using a fringing effect and a method of manufacturing the same. A through hole is formed through a plurality of gate electrodes vertically stacked on a substrate, and the interior of the through hole is filled with a tunneling insulating layer or an active region. Therefore, a charge storage layer is not formed in the through hole, but is formed outside of the through hole. The charge storage layer is formed in an intercell insulating layer filling a gap between the gate electrodes. When a fringing electric field is applied, the electric charges of the active region are trapped in the charge storage layer through the intercell insulating layer.

20 Claims, 10 Drawing Sheets

(56) References Cited

FOREIGN PATENT DOCUMENTS

| KR | 20110012806 A | 2/2011 |
|----|---------------|--------|
| KR | 20110015338 A | 2/2011 |
| KR | 20110015339 A | 2/2011 |
| KR | 1020110012806 A | 2/2011 |
| KR | 1020110015338 A | 2/2011 |
| KR | 1020110015339 A | 2/2011 |

OTHER PUBLICATIONS

International Search Report mailed Dec. 26, 2012; PCT/KR2012/004639.

* cited by examiner

THREE-DIMENSIONAL FLASH MEMORY USING FRINGING EFFECT AND METHOD FOR MANUFACTURING

TECHNICAL FIELD

The present invention relates to a non-volatile memory and a method of manufacturing the same, and more particularly, to a three-dimensional flash memory and a method of manufacturing the same.

BACKGROUND ART

A non-volatile memory device, a representative example of which is a flash memory, has a characteristic capable of retaining stored data even when a power supply is removed. Particularly, due to recent developments in semiconductor process technology, design rules are continuously becoming narrower, and storage capacities are increasing.

Due to this increasing capacity, flash memories are being widely used as storage memories in mobile devices, digital cameras, etc., and at the time of filing of this specification, mass production of 32 Gbit products with a scale of about 30 nm is being predicted. The scale is also predicted to decrease to between 10 nm and 20 nm due to processing technology of floating gates, which are elements storing electric charges in flash memories. Various efforts in search of structures other than a two-dimensional planar cell structure that maximize the storage capacity are continuously being attempted. As an example, to overcome limits of integration in a two-dimensional structure, studies on three-dimensional structures are actively proceeding.

Particularly, there is less of a burden in adding a contact in a flash memory, in which an element storing data is formed in the cell transistor, than in other memory devices. Accordingly, it is easy to form a string structure connecting individual memory cells in series, and there is a merit in that the memory cell can be implemented in a vertical type. One recent example of a three-dimensional NAND flash memory structure is a BiCS (Bit Cost Scalable) structure.

FIG. 1 is a cross-sectional view illustrating a three-dimensional NAND flash memory structure according to a related art.

Referring to FIG. 1, a disclosed structure shows a conventional BiCS structure. That is, control gates 100 which are alternately stacked on a substrate (not illustrated) in a vertical direction are formed, and a charge storage region 110 and a channel layer 120 are formed in an internal space. That is, a region that passes through a center of the control gates 100 consists of a blocking insulating layer 115, a charge trap layer 113 and a tunneling insulating layer 111 for storing electric charges. An internal space in contact with the tunneling insulating layer 111 is filled with the channel layer 120 formed of a polycrystalline silicon material, and a gap between the control gates 100 is filled with an insulating material 130.

In the above-described structure, the charge storage region 110 usually has an ONO structure. That is, an oxide-nitride-oxide stacked structure forms the tunneling insulating layer 111—the charge trap layer 113—the blocking insulating layer 115. The ONO structure should be set to have a thickness of 10 nm to 20 nm in an actual manufacturing process. A polycrystalline silicon layer in contact with the ONO structure should be filled in the structure having a high aspect ratio. Particularly, when a conventional deposition process such as CVD or ALD is used for the ONO structure, it is difficult to form a uniform thickness in a hole passing through the control gates 100. That is, because a depth to which a deposited material should penetrate is great, a thickness of the ONO tends to be smaller at lower portions and relatively increase toward upper portions.

When the thickness of the ONO is not constant in the hole passing through the control gates 100, there is a problem in that the channel layer 120 including the polycrystalline silicon material which ultimately fills the internal space is not formed easily. Also, because of a high aspect ratio, there is a limit to adding a plurality of cell transistors to the string structure.

The above-described problem is due to a unique structure of the charge storage region 110. That is, since the charge storage region 110 has the ONO structure, a plurality of heterogeneous films are stacked. Therefore, at least two deposition processes are performed in order to form the charge storage region 110. The repetition of deposition processes causes problems such as a reduction in uniformity of heterogeneous films, and a reduction in uniformity of a threshold voltage among cell transistors in one string.

DISCLOSURE

Technical Problem

A first purpose of the present invention for solving the above-mentioned problem is to provide a flash memory using a fringing field.

A second purpose of the present invention is to provide a manufacturing method of the flash memory used to achieve the first purpose.

Technical Solution

The present invention for achieving the first purpose provides a flash memory including an active region having a semiconductor material, a tunneling insulating layer formed on the active region, gate electrodes formed on the tunneling insulating layer, an intercell insulating layer configured to fill a gap between the gate electrodes and formed on the tunneling insulating layer, and a charge storage layer formed in the intercell insulating layer to store electric charges through a fringing effect of an electric field which is applied from the gate electrode.

The first purpose of the present invention is achieved by providing a flash memory including an active region having a semiconductor material, a gate insulating layer formed on the active region, gate electrodes formed on the gate insulating layer, an intercell insulating layer configured to fill a gap between gate electrodes and formed on the active region, and a charge storage layer formed in the intercell insulating layer to store electric charges through a fringing effect of an electric field which is applied from the gate electrode.

The present invention for achieving the second purpose provides a method of manufacturing a flash memory including alternately stacking a gate electrode and an intercell insulating layer on a substrate, forming a through hole passing through the gate electrode and the intercell insulating layer in a first direction, forming a tunneling insulating layer on a sidewall of the through hole, and forming an active region that fills a space divided by the tunneling insulating layer, wherein the intercell insulating layer includes a charge storage layer for storing electric charges through a fringing effect, and the charge storage layer extends in a second direction perpendicular to the first direction.

The second purpose of the present invention is achieved by a method of manufacturing a flash memory including alternately stacking a sacrificial layer and an intercell insulating layer on a substrate, forming a through hole passing through the sacrificial layer and the intercell insulating layer in a first direction, forming an active region on a sidewall of the through hole, removing the sacrificial layer, and leaving the active region extending in the first direction and the intercell insulating layer extending in a second direction perpendicular to the first direction, forming a gate insulating layer in the second direction in a space from which the sacrificial layer is removed, and forming a gate electrode in contact with the gate insulating layer in the second direction, wherein the intercell insulating layer includes a charge storage layer for storing electric charges through a fringing effect, and the charge storage layer extends in the second direction perpendicular to the first direction.

Advantageous Effects

According to the present invention, a structure of a blocking insulating layer included in a structure of a conventional flash memory is omitted. That is, there is no blocking insulating layer between a charge trap layer for storing electric charges and a control gate. Instead, program and erase operations are performed using a charge storage layer formed in an intercell insulating layer.

Thus, technical difficulties in forming a through hole to form a string structure and forming a plurality of films in the through hole can be overcome. That is, since the charge storage layer and the blocking insulating layer are not formed in the through hole, uniformity of electrical characteristic between flash memories connected in series can be preserved.

Further, since a charge storage layer and a blocking insulating layer are not formed in the through hole and the charge storage layer is formed in an insulating material between gate electrodes, there is a benefit in that a degree of integration of the string structure can be improved.

MODES OF THE INVENTION

Figure 1:
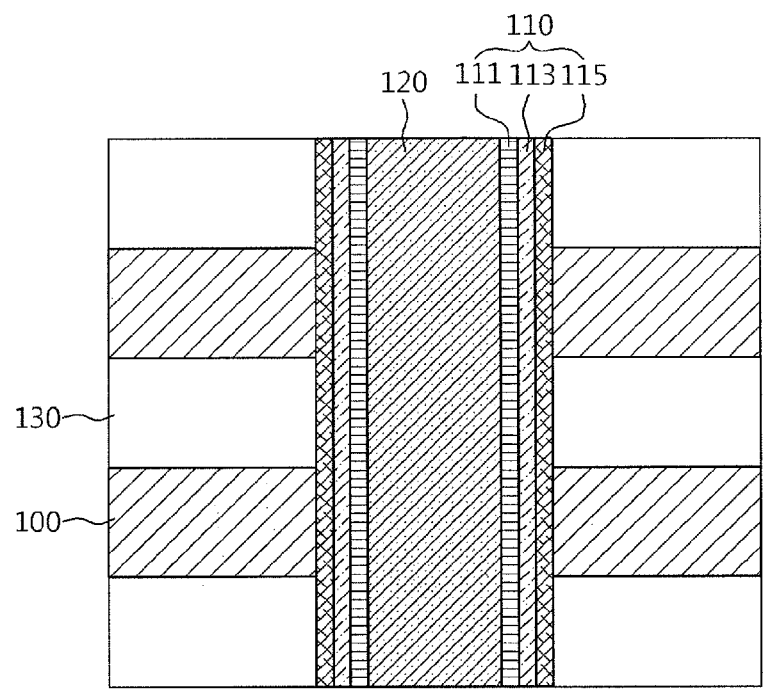
FIG. 1 is a cross-sectional view illustrating a three-dimensional NAND flash memory structure according to a related art.

While the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention. Like reference numerals refer to like elements throughout the description of the figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined here.

Hereinafter, embodiments of the present invention will be described in detail with reference to the accompanying drawings.

EMBODIMENT

Figure 2:
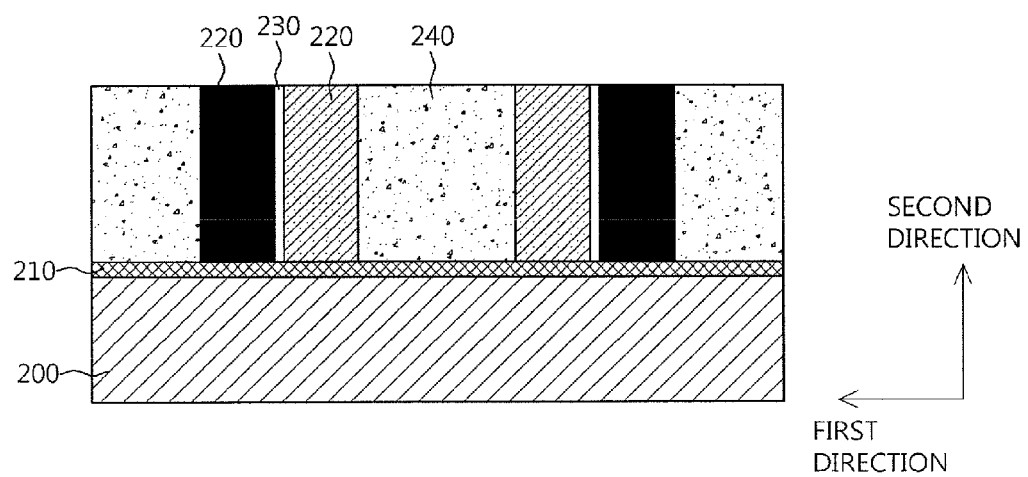
FIG. 2 is a cross-sectional view for describing a structure of a flash memory according to an exemplary embodiment of the present invention.

FIG. 2 is a cross-sectional view for describing a structure of a flash memory according to an exemplary embodiment of the present invention.

Referring to FIG. 2, a flash memory according to the present invention includes an active region 200, a tunneling insulating layer 210, an intercell insulating layer 220, a charge storage layer 230 and a gate electrode 240.

The active region 200 is formed in a first direction. The active region 200 is formed of a semiconductor material and supplies electric charges according to an applied voltage of the gate electrode 240. Therefore, the active region 200 is foamed of a silicon material, preferably polycrystalline silicon. According to an embodiment, the active region 200 may be doped with a specific conductivity type.

The tunneling insulating layer 210 is provided in a second direction which is perpendicular to the first direction from the active region 200. The tunneling insulating layer 210 may be formed by a thermal oxidation process or a conventional deposition process. In the thermal oxidation process, the tunneling insulating layer 210 may be formed by supplying oxygen at a specific temperature environment. The conventional deposition process may include chemical vapor deposition, physical vapor deposition or atomic layer deposition.

The intercell insulating layer 220 is formed in the second direction from the tunneling insulating layer 210. Particularly, the intercell insulating layer 220 is formed by filling a gap between the gate electrodes 240 adjacent to each other. The intercell insulating layer 220 is formed of an insulating material, and preferably a material having a high dielectric constant (high-k) characteristic. Therefore, the intercell insulating layer 220 may include $Al_2O_3$, $HfO_2$, $TiO_2$, $La_2O_5$, $BaZrO_3$, $Ta_2O_5$, $ZrO_2$, $Gd_2O_3$ or $Y_2O_3$. According to an embodiment, the intercell insulating layer 220 may be formed of the same material as the tunneling insulating layer 210.

The charge storage layer 230 is formed in the intercell insulating layer 220. The charge storage layer 230 may be formed in the form of a quantum dot or a specific film. Particularly, the charge storage layer 230 is formed to extend in the second direction perpendicular to the first direction.

When the charge storage layer 230 is provided in the form of a quantum dot, the charge storage layer 230 may include a semiconductor element, or a metal and a magnetic material.

For example, when the charge storage layer 230 includes a semiconductor element, the quantum dot forming the same may be formed of nano particles such as C, Si, SiGe, SiN, GaN or ZnO. When the charge storage layer 230 is formed of the metal and magnetic material, the quantum dot forming the same may be formed of nano particles such as W, Co, Ti or Pd.

However, the quantum dot disclosed in this embodiment of the present invention is only an example, and any kind of material capable of collecting electric charges transferred from the active region 200 may be used.

When the charge storage layer 230 is provided in the form of a specific film, the charge storage layer 230 may be formed of SiN or polycrystalline silicon.

The gate electrode 240 is formed on a side surface of the intercell insulating layer 220. The gate electrode 240 is provided by filling a gap between the intercell insulating layers 220 adjacent to each other. Any conductive material is possible as a material of the gate electrode 240, but it is preferably formed of the metal or polycrystalline silicon. Therefore, the intercell insulating layer 220 and the gate electrode 240 are formed on the tunneling insulating layer 210, and the charge storage layer 230 is formed in the intercell insulating layer 220.

Figure 3:
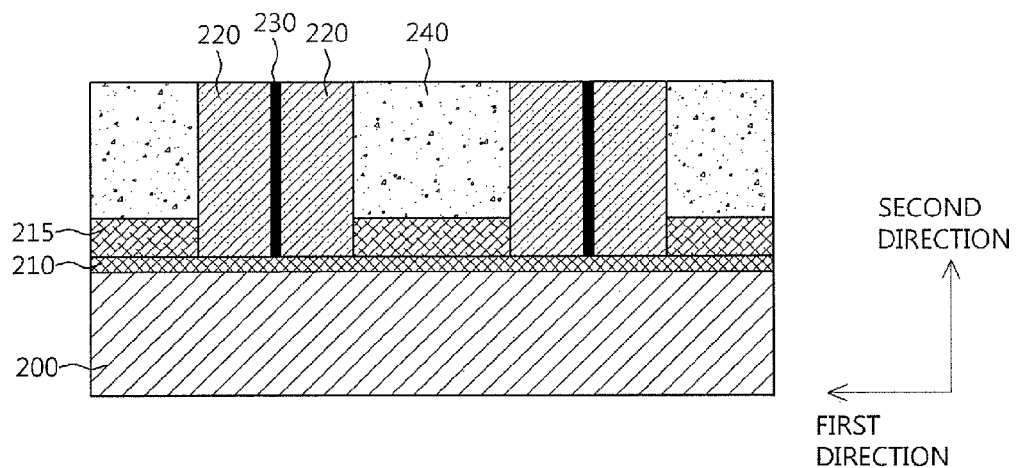
FIG. 3 is another cross-sectional view for describing a structure of a flash memory according to an exemplary embodiment of the present invention.

FIG. 3 is another cross-sectional view for describing a structure of a flash memory according to an exemplary embodiment of the present invention.

Referring to FIG. 3, a flash memory according to the present invention includes an active region 200, a tunneling insulating layer 210, a gate insulating layer 215, an intercell insulating layer 220, a charge storage layer 230 and a gate electrode 240.

Particularly, in FIG. 3, the configuration and material of the active region 200 and the tunneling insulating layer 210 are the same as described in FIG. 2.

The gate insulating layer 215 is formed in a second direction from the tunneling insulating layer 210 and formed under the gate electrode 240. Particularly, the gate insulating layer 215 is formed between the gate electrode 240 and the active region 200. This prevents the active region 200 from malfunctioning due to an electric field applied from the gate electrode 240 as a distance between the gate electrode 240 made of a metallic material and the active region 200 increases. Particularly, a tunneling phenomenon in which a strong electric field is applied from the gate electrode 240 and electric charges are directly transferred from the active region 200 to the gate electrode 240 may be prevented. Therefore, a thickness of the gate insulating layer 215 may exceed a thickness of the tunneling insulating layer 210.

Other configurations and materials of the intercell insulating layer 220 and the charge storage layer 230 are the same as described in FIG. 2.

Figure 4:
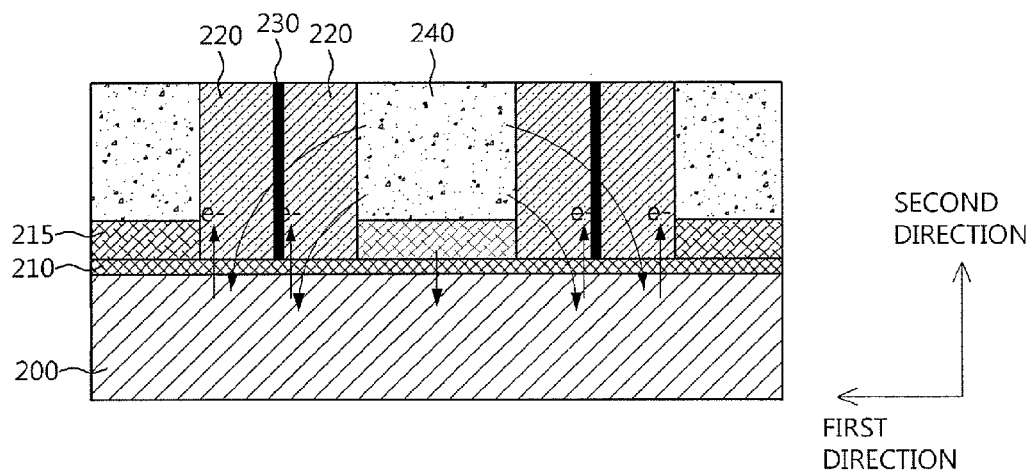
FIG. 4 is a schematic diagram for describing a program operation and an erase operation of the flash memory illustrated in FIG. 3.

FIG. 4 is a schematic diagram for describing a program operation and an erase operation of the flash memory illustrated in FIG. 3.

Referring to FIG. 4, a program voltage is applied between the gate electrode 240 and the active region 200. By applying the program voltage, a fringing field is formed on a side surface of the gate electrode 240. Accordingly, electric charges of the active region 200 which is formed under the intercell insulating layer 220 pass through the intercell insulating layer 220, and are collected at the charge storage layer 230. The electric charges trapped in the charge storage layer 230 which is formed in the intercell insulating layer 220 may pass directly through the preformed tunneling insulating layer 210. That is, the electric charges may be collected through the tunneling insulating layer 210 without going through the intercell insulating layer 220.

When the tunneling insulating layer 210 is not formed, the active region 200 is in direct contact with the intercell insulating layer 220 and the charge storage layer 230 formed in the intercell insulating layer 220 is also in direct contact with the active region 200. In this case, the charge storage layer 220 may more easily trap the electric charges when applying the program voltage.

According to the program operation, the electric charges stored in the charge storage layer 230 apply an electric field to the active region 200, and a threshold voltage of cells which is required to foam a channel in the active region 200 is increased.

An erase operation is performed complementarily to the program operation. That is, the electric charges trapped in the charge storage layer 230 are transferred to the active region 200 by applying an erasing voltage. Therefore, the threshold voltage of the cells is less than in the program operation.

Through the above described process, the program and erase operations of the flash memory may be performed.

Particularly, by controlling voltages applied to the adjacent gate electrodes, the flash memory of the present invention may implement two or more states. Therefore, two or more bits of data may be stored through one memory cell.

Figure 5:
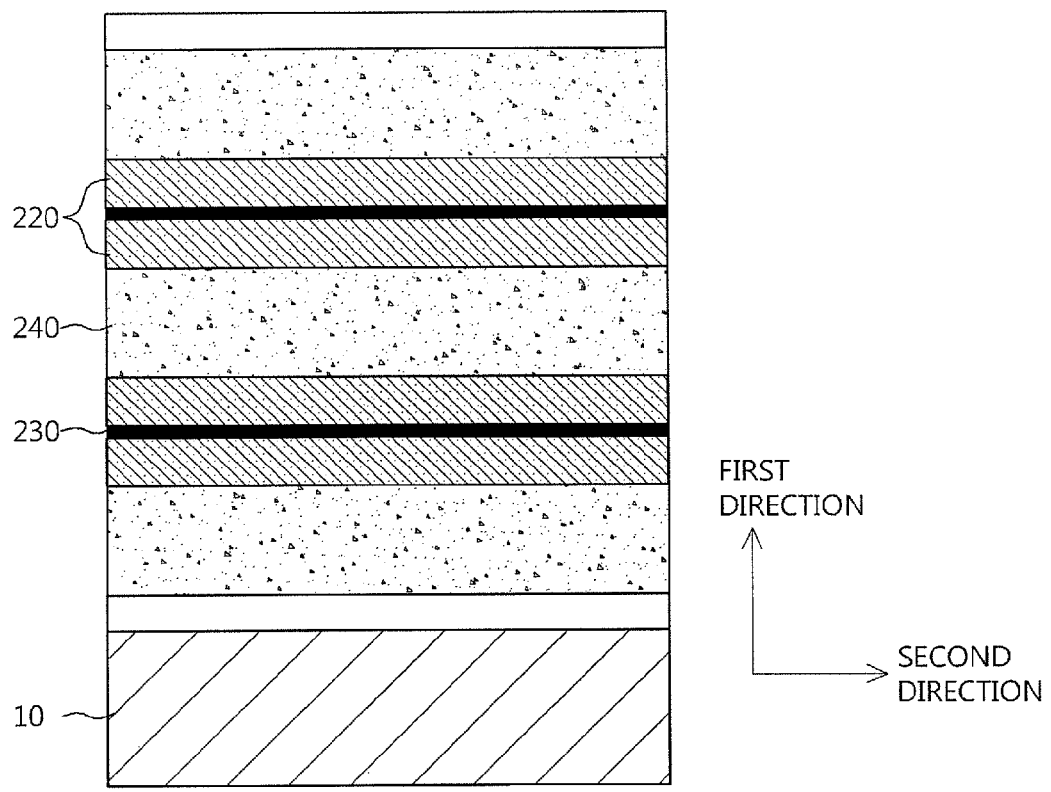
FIGS. 5 to 7 are cross-sectional views for describing a manufacturing method of the flash memory illustrated in FIG. 2 according to an exemplary embodiment of the present invention.
Figure 6:
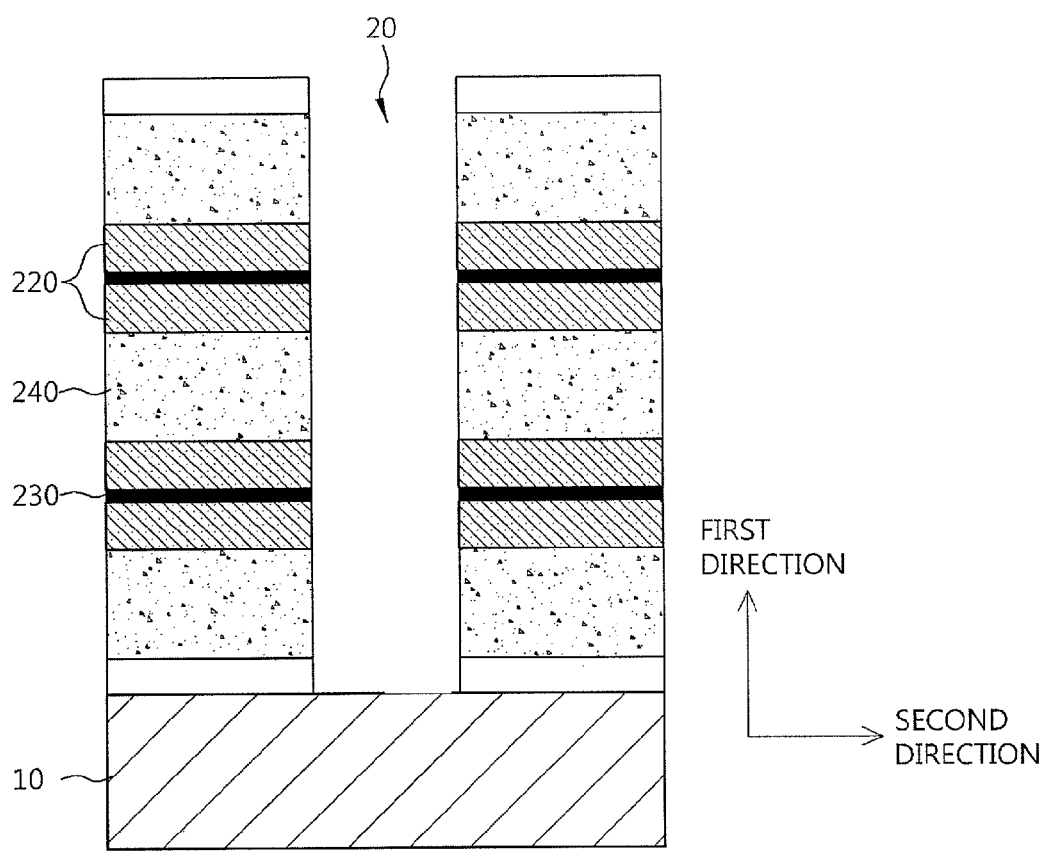
Figure 7:
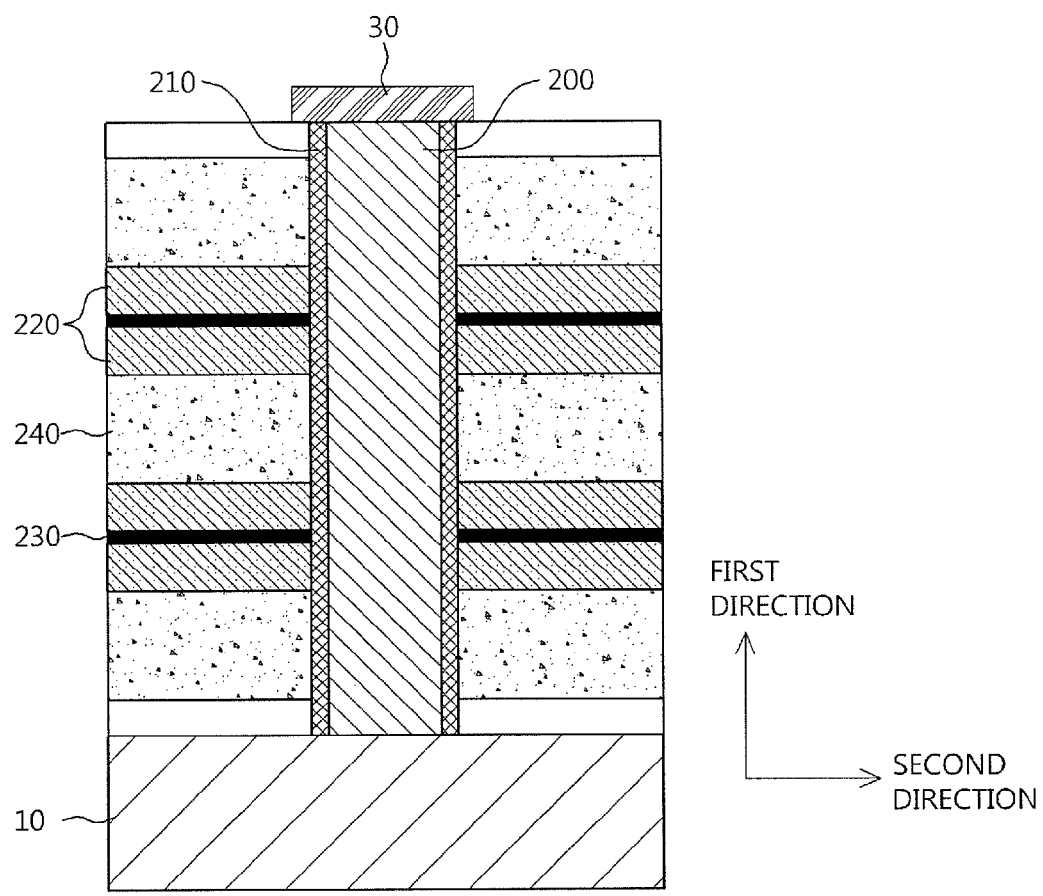

FIGS. 5 to 7 are cross-sectional views for describing a manufacturing method of the flash memory illustrated in FIG. 2 according to an exemplary embodiment of the present invention.

Particularly, FIGS. 5 to 7 show manufacturing, in the form of a string, the flash memory of FIG. 2 disclosed in an individual unit.

First of all, referring to FIG. 5, an intercell insulating layer 220 and a gate electrode 240 are sequentially stacked in a first direction on a substrate 10. Particularly, the charge storage layer 230 is included in the intercell insulating layer 220.

Particularly, the intercell insulating layer 220 and the charge storage layer 230 which is formed therein may be formed by sequential stacking. For example, a portion of the intercell insulating layer the 220 is formed first on the gate electrode 240. Any insulating material can be used as the intercell insulating layer 220.

Next, the charge storage layer 230 is formed on the intercell insulating layer 220 which is formed to be about half as thick. The charge storage layer 230 may be provided in various forms. For example, the charge storage layer 230 may be provided in the form of a dispersed quantum dot made of nano particles, or a film.

Particularly, when the charge storage layer 230 is provided in the form of a quantum dot, the charge storage layer 230 may be formed of nano particles such as C, Si, SiGe, SiN, GaN or ZnO, or nano particles such as W, Co, Ti or Pd. The quantum dot may be formed through various methods. Preformed nano particles are generally dispersed in a solvent, and the nano particles-dispersed solution is coated on the intercell insulating layer 220 which is a lower film through spin coating. Next, the solvent is removed through post heat treatment, and the quantum dot may be formed using cohesion of the nano particles. In addition, the nano-sized quantum dot may be formed through sputtering, etc. of a target material.

Next, the upper portion of the quantum dot is filled with the intercell insulating layer 220 through conventional deposition. Therefore, a structure in which the charge storage layer 230 is formed in the intercell insulating layer 220 is realized.

As described above, the charge storage layer 230 may be formed as a film. Particularly, SiN or polycrystalline silicon is used as the charge storage layer 230 to collect electric charges. For this, chemical vapor deposition, physical vapor deposition or atomic layer deposition may be used.

The gate electrode 240 which is formed alternately with the intercell insulating layer 220 is formed of a conductive material. Therefore, the gate electrode 240 may be formed of a metal or polycrystalline silicon. The gate electrode 240 is formed through a conventional deposition process.

In this embodiment, it is illustrated that an insulating layer is formed on the substrate 10 and the gate electrode 240 is formed thereon, but according to an embodiment, another functional film may be added between the substrate 10 and the gate electrode 240. Although it is illustrated that the insulating layer is formed as the uppermost layer, another functional film other than the insulating layer may be added on the uppermost gate electrode 240.

Numbers of the gate electrodes 240 and the intercell insulating layers 220 are changeable according to selection of the number of memory cells included in the string structure, which is obvious to those skilled in the art.

Referring to FIG. 6, a through hole 20 is formed through an etching process of the structure disclosed in FIG. 5. The through hole 20 extends from an uppermost insulating layer to a point at which the lower substrate 10 or a film which performs another function is exposed in a first direction.

The through hole 20 is formed through a conventional photolithography process. For example, a photoresist is coated on an uppermost insulating layer, and a photoresist pattern is formed through the photolithography process. Etching is performed using the formed photoresist pattern as an etching mask, and thus the through hole 20 is formed. Some surfaces of the gate electrode 240 and the intercell insulating layer 220 are exposed in an internal space of the through hole 20 by forming the through hole 20.

Referring to FIG. 7, the through hole is filled by performing a deposition process.

First, a tunneling insulating layer 210 is formed in contact with an inner wall of the through hole. The tunneling insulating layer 210 is formed by a thermal oxidation process or a conventional deposition process. The tunneling insulating layer 210 is preferably a silicon oxide material.

Next, the through hole on which the tunneling insulating layer 210 is formed is fully filled, and thus an active region 200 is formed. The active region 200 should have a semiconductor material, and polycrystalline silicon is preferably filled therein. A metal electrode 30 is connected to an upper portion of the active region 200 which fills the through hole, and thus a bias may be applied to the active region 200.

In the flash memory formed through to the process described in FIG. 2, program and erase operations using a fringing field are possible. The fringing field denotes an electric field that leaks out at an edge or border of a strip line toward the outside. Using the fringing field, the gate electrode 240 disclosed in FIG. 2 may perform an operation of trapping electric charges in the charge storage layer 230 formed in the intercell insulating layer 220. That is, by using the electric field applied through the intercell insulating layer 220 among the electric fields applied between the gate electrode 240 and the active region 200, the electric charges in the active region 200 are stored in the charge storage layer 230. Therefore, the active region 200 disposed under the intercell insulating layer 220 which includes the charge storage layer 230 may retain a high threshold voltage due to the trapped electric charges. The erase operation is also performed complementarily to the program operation. That is, by using the fringing field, the electric charges trapped in the charge storage layer 230 are transferred to the lower active region 200, and thus the erase operation is performed.

FIGS. 8 to 12 are cross-sectional views for describing a manufacturing method of the flash memory illustrated in FIG. 3 according to an exemplary embodiment of the present invention.

Particularly, FIGS. 8 to 12 show manufacturing, in the form of a string, the flash memory of FIG. 3 disclosed in an individual unit.

Figure 8:
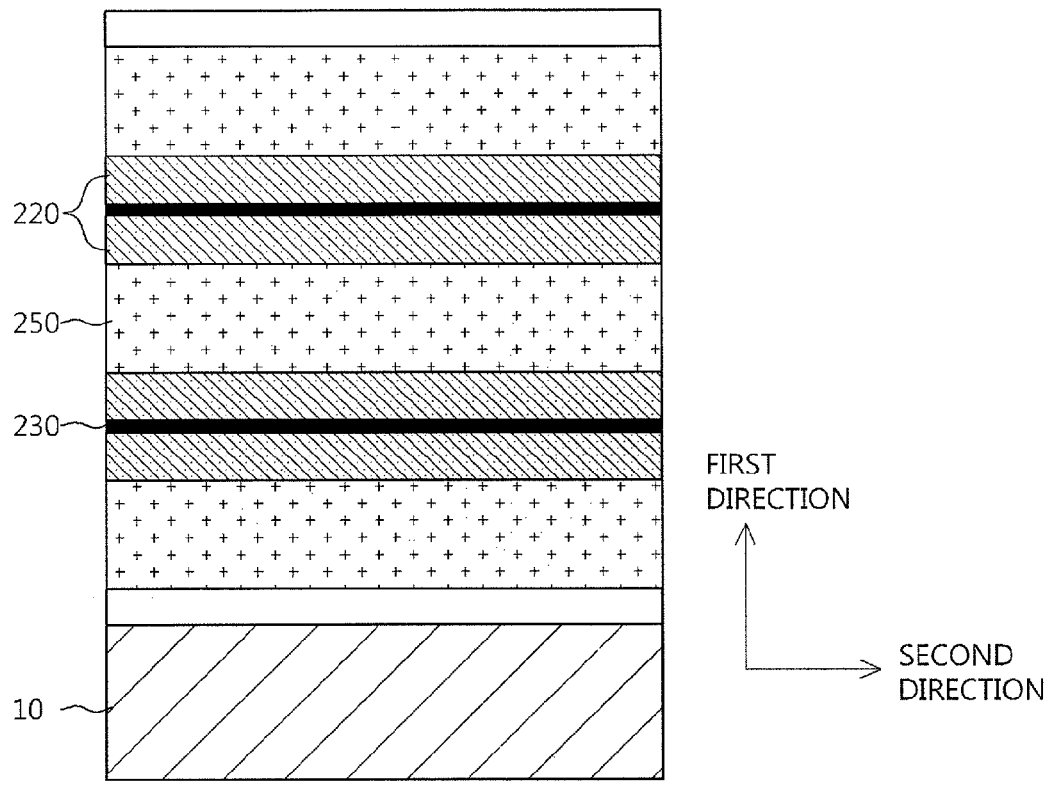
FIGS. 8 to 12 are cross-sectional views for describing a manufacturing method of the flash memory illustrated in FIG. 3 according to an exemplary embodiment of the present invention.

First, referring to FIG. 8, a sacrificial layer 250 and an intercell insulating layer 220 are alternately formed in a first direction on a substrate 10. Any material having an etching selectivity with respect to the intercell insulating layer 220 can be used as the material of the sacrificial layer 250. For example, when the intercell insulating layer 220 is silicon oxide, a nitride layer, etc. may be used as the material having an etching selectivity with respect to the intercell insulating layer 220. Since the intercell insulating layer 220 is a material having electric insulation, in contrast, the sacrificial layer 250 may be a conductive material having a predetermined conductivity.

The intercell insulating layer 220 is formed as disclosed in FIG. 5. For example, a portion of the intercell insulating layer 220 is formed on the sacrificial layer 250, and the charge storage layer 230 is formed on the intercell insulating layer 220 to a predetermined thickness. Next, the remaining portion of the intercell insulating layer 220 which fills the charge storage layer 230 is formed. Therefore, the intercell insulating layer 220 having the charge storage layer 230 therein is formed.

Figure 9:
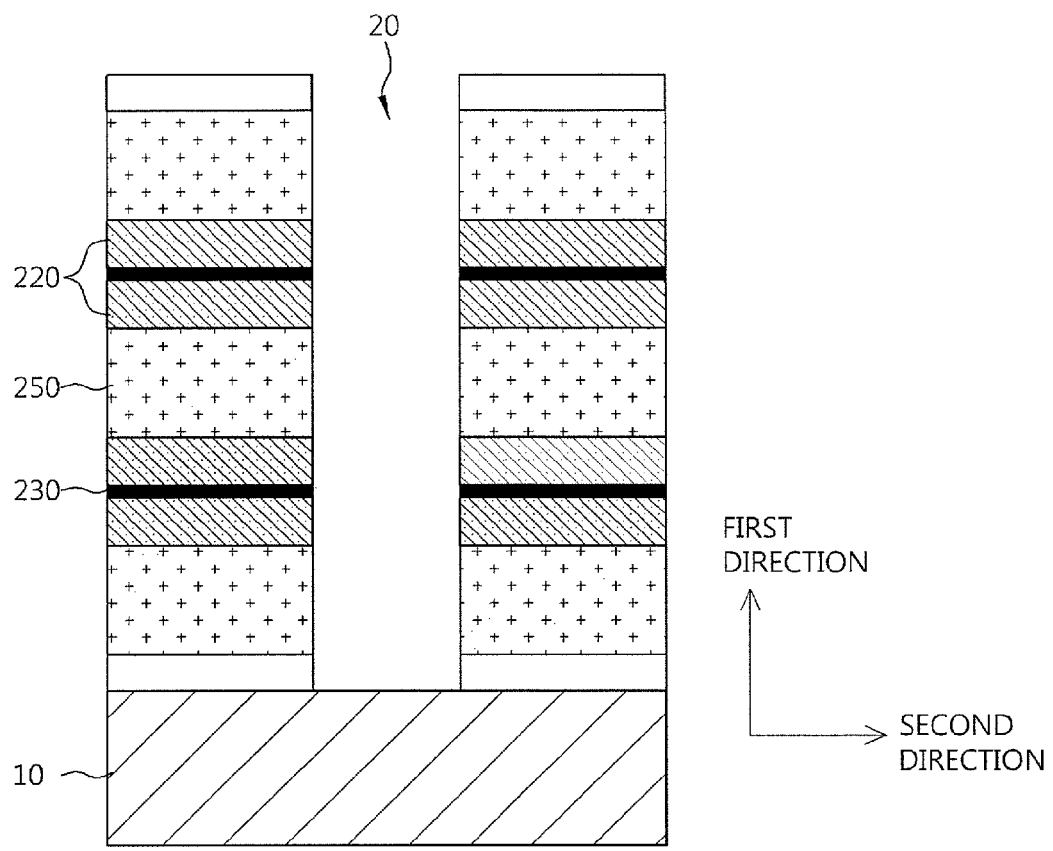

Next, referring to FIG. 9, a through hole 20 is formed in a first direction by performing an etching process on the structure illustrated in FIG. 8. The through hole 20 is formed using conventional photolithography and etching processes. For example, a photoresist is coated on a top surface of the structure in FIG. 8, and a photoresist pattern is formed using the conventional photolithography process. Etching is performed using the formed photoresist pattern as an etching mask, and thus the through hole 20 is formed.

By forming the through hole 20, some surfaces of the sacrificial layer 250 and some surfaces of an intercell insulating layer 220 are exposed in the direction in which the through hole 20 is formed.

Figure 10:
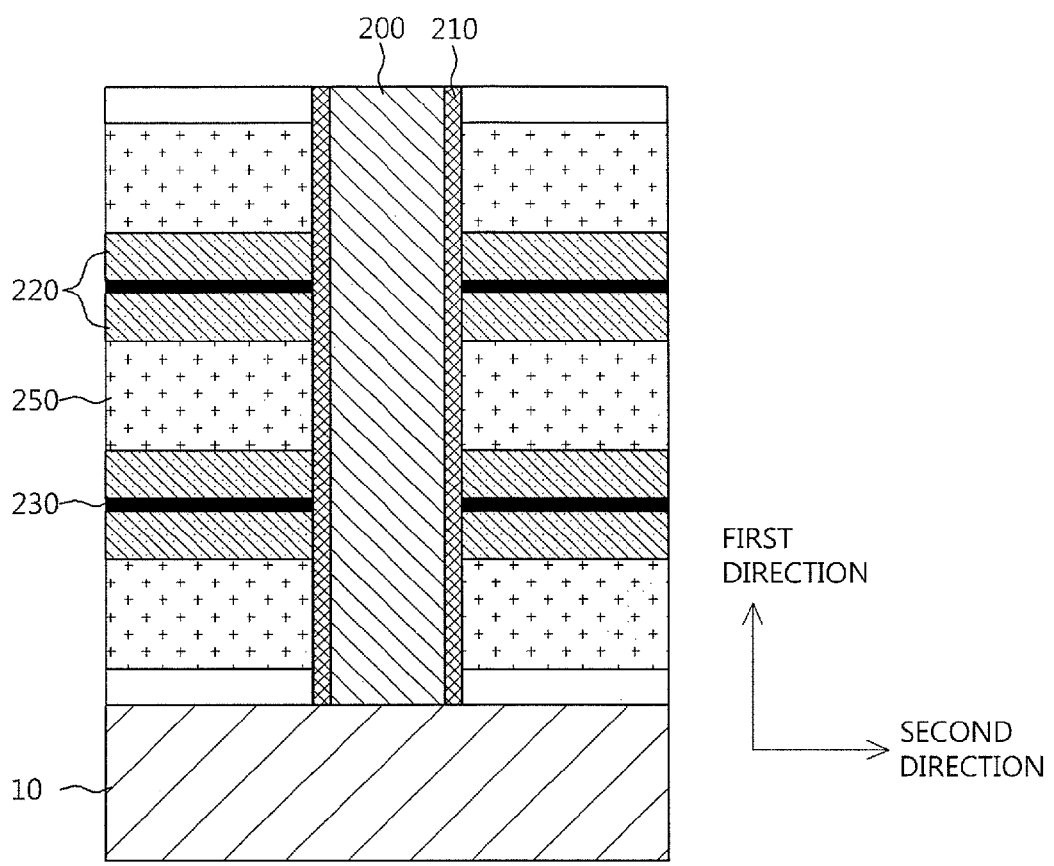

Referring to FIG. 10, a tunneling insulating layer 210 and an active region 200 are formed in the through hole. The tunneling insulating layer 210 and the active region 200 are formed as disclosed in FIG. 7.

However, the forming of the tunneling insulating layer 210 may be omitted. That is, in FIG. 10, the active region 200 may be directly formed to fill the through hole without forming the tunneling insulating layer 210. Therefore, the active region 200 and the intercell insulating layer 220 may be in direct contact with each other.

Figure 11:
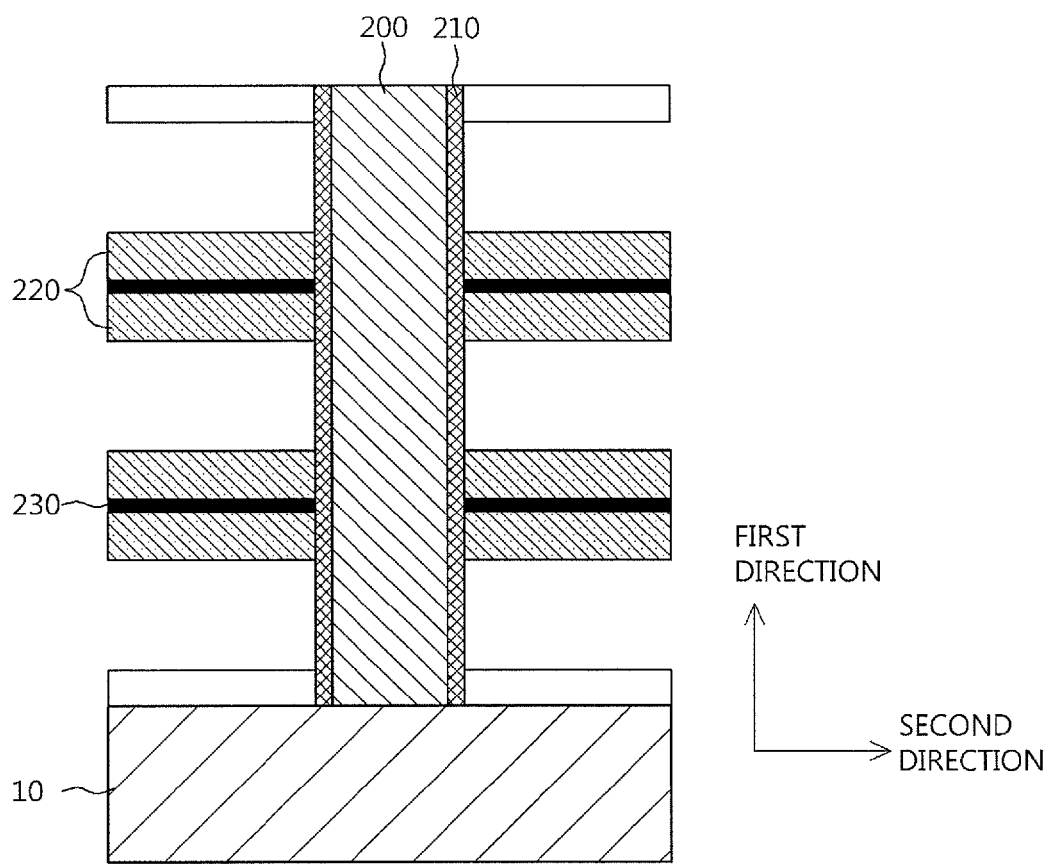

Referring to FIG. 11, the sacrificial layer 250 is removed by selectively etching the structure of FIG. 10. Because the sacrificial layer 250 is a material having an etching selectivity with respect to the intercell insulating layer 220, the intercell insulating layer 220 remains even when the sacrificial layer 250 is removed. The tunneling insulating layer 210 and the active region 200 also remain.

Therefore, some surfaces of the intercell insulating layer 220 and some surfaces of the tunneling insulating layer 210 are exposed through a space from which the sacrificial layer 250 is removed. In FIG. 10, when the forming process of the tunneling insulating layer 210 is omitted, some surfaces of the active region 200 consisting of a polycrystalline silicon material may be exposed.

Therefore, the tunneling insulating layer 210 or the active region 200 extending in the first direction remains, and the intercell insulating layer 220 extending in the second direction and the charge storage layer 230 which is formed therein also remain.

Figure 12:
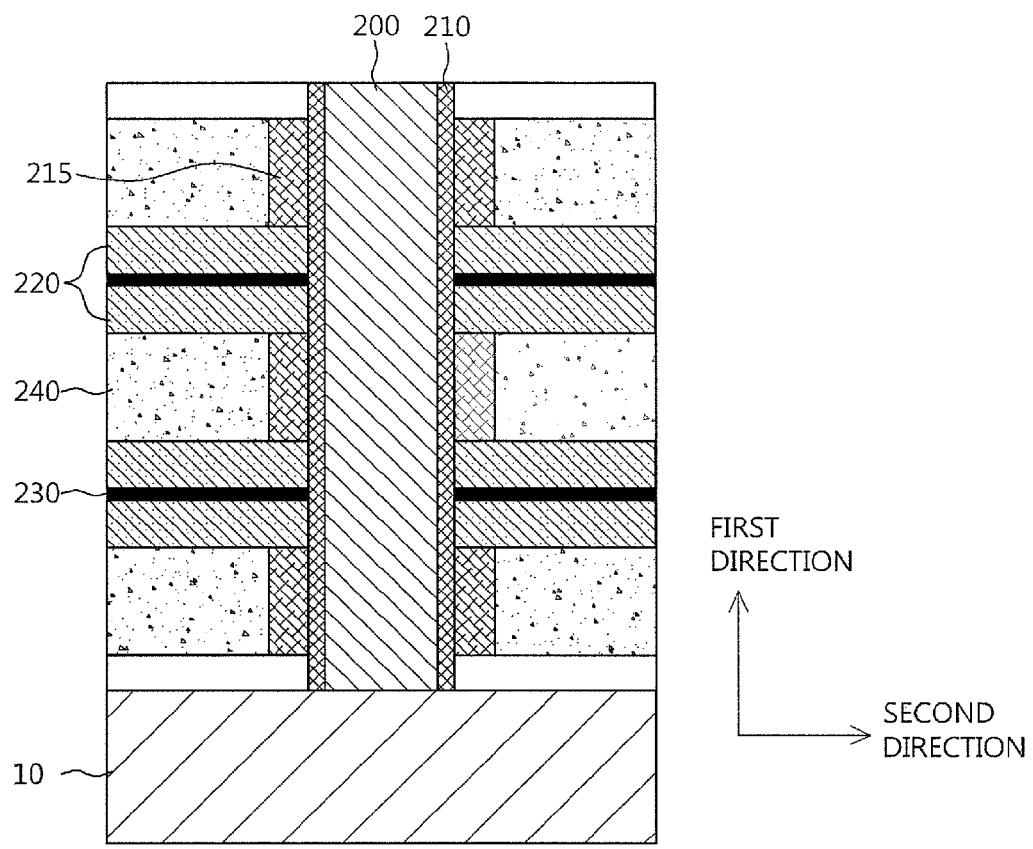

Referring to FIG. 12, a gate insulating layer 215 is formed on a portion on which the sacrificial layer is removed according to FIG. 11. That is, the gate insulating layer 215 is formed in the second direction in which an exposed side surface of the tunneling insulating layer 210 is located. If the tunneling insulating layer 210 is not formed, the gate insulating layer 215 is directly formed in the second direction from an active region 200.

The gate insulating layer 215 may be formed of oxide or nitride. Therefore, the gate insulating layer 215 may be formed of silicon oxide or silicon nitride. The gate insulating layer 215 may also be formed of a high-k material. Examples thereof include $Al_2O_3$, $HfO_2$, $TiO_2$, $La_2O_5$, $BaZrO_3$, $Ta_2O_5$, $ZrO_2$, $Gd_2O_3$ or $Y_2O_3$.

Next, a gate electrode 240 is filled in a space in contact with the gate insulating layer 215 in the second direction. Therefore, the gate electrode 240 fills a space defined by the intercell insulating layer 220 and the gate insulating layer 215. The gate electrode 240 is formed of a conductive metal material or polycrystalline silicon. Therefore, the gate electrode 240 is formed through a conventional deposition process.

The gate insulating layer 215 is preferably formed of a high-k material. Therefore, an electric field which is applied between the gate electrode 240 and the active region 200 is concentrated on the intercell insulating layer 220, electric charges are transferred by a fringing effect, and a program operation and an erase operation may be performed.

In present invention, a blocking insulating layer structure of a conventional flash memory structure is omitted. That is, there is no blocking insulating layer between the charge trap layer in which electric charges are stored and a control gate. Instead, program and erase operations may be performed using the charge storage layer formed in the intercell insulating layer.

Further, technical difficulties in forming a through hole to form a string structure and forming a plurality of films in the through hole can be overcome. That is, since the charge storage layer and the blocking insulating layer are not formed in the through hole, uniformity of electrical characteristic between flash memories connected in series can be maintained.

Also, since the charge storage layer and the blocking insulating layer are not formed in the through hole and the charge storage layer is formed in the insulating material between gate electrodes, there is a benefit in that a degree of integration of the string structure can be improved.

The invention claimed is:

1. A flash memory comprising:
an active region having a semiconductor material;
a tunneling insulating layer formed on the active region;
a gate electrode formed on the tunneling insulating layer;
an intercell insulating layer configured to fill a gap between the gate electrodes and formed on the tunneling insulating layer; and
a charge storage layer formed in the intercell insulating layer to store electric charges through a fringing effect of an electric field which is applied from the gate electrode.

2. The flash memory of claim 1, wherein the intercell insulating layer is formed in contact with the gate electrode in a first direction.

3. The flash memory of claim 2, wherein the charge storage layer is formed to extend in a second direction perpendicular to the first direction.

4. The flash memory of claim 1, wherein the charge storage layer has a quantum dot shape.

5. The flash memory of claim 3, wherein the charge storage layer extends from one side of the tunneling insulating layer and passes through the interior of the intercell insulating layer.

6. The flash memory of claim 1, wherein the gate electrode is in direct contact with the tunneling insulating layer.

7. A flash memory comprising:
an active region having a semiconductor material;
a gate insulating layer formed on the active region;
a gate electrode formed on the gate insulating layer;
an intercell insulating layer configured to fill a gap between the gate electrodes and formed on the active region; and
a charge storage layer formed in the intercell insulating layer to store electric charges through a fringing effect of an electric field which is applied from the gate electrode.

8. The flash memory of claim 7, further comprising:
a tunneling insulating layer formed on the active region,
wherein the gate insulating layer, the intercell insulating layer and the charge storage layer are formed on one side of the tunneling insulating layer.

9. The flash memory of claim 8, wherein a thickness of the gate insulating layer exceeds that of the tunneling insulating layer.

10. The flash memory of claim 7, wherein the gate insulating layer prevents a tunneling phenomenon in which an electric field is applied from the gate electrode, so that electric charges are directly transferred from the active region to the gate electrodes.

11. The flash memory of claim 7, wherein the intercell insulating layer is formed in contact with the gate electrode in a first direction, and the gate insulating layer and the gate electrodes are stacked from the active region in a second direction perpendicular to the first direction.

12. The flash memory of claim 11, wherein the charge storage layer has a quantum dot shape.

13. A method of manufacturing a flash memory, comprising:
alternately stacking a gate electrode and an intercell insulating layer on a substrate;
forming a through hole passing through the gate electrode and the intercell insulating layer in a first direction;
foaming a tunneling insulating layer on a sidewall of the through hole; and
forming an active region that fills a space defined by the tunneling insulating layer,
wherein the intercell insulating layer includes a charge storage layer for storing electric charges through a fringing effect, and the charge storage layer extends in a second direction perpendicular to the first direction.

14. A method of manufacturing a flash memory, comprising:
alternately stacking a sacrificial layer and an intercell insulating layer on a substrate;
forming a through hole passing through the sacrificial layer and the intercell insulating layer in a first direction;
forming an active region on a sidewall of the through hole;
leaving the active region extending in the first direction and the intercell insulating layer extending in a second direction perpendicular to the first direction by removing the sacrificial layer;
forming a gate insulating layer in the second direction in a space from which the sacrificial layer is removed; and
forming a gate electrode in contact with the gate insulating layer in the second direction,
wherein the intercell insulating layer includes a charge storage layer for storing electric charges through a fringing effect, and the charge storage layer extends in the second direction perpendicular to the first direction.

15. The method of claim 13 or 14, wherein the forming of the intercell insulating layer including the charge storage layer includes forming a portion of the intercell insulating layer, forming the charge storage layer on the portion of the intercell insulating layer, and forming the rest of the intercell insulating layer on the charge storage layer.

16. The method of claim 13 or 14, wherein the charge storage layer has a quantum dot shape.

17. The method of claim 16, wherein the charge storage layer is formed by:
  dispersing preformed nano particles into a solvent, and coating the nano particles-dispersed solution on the intercell insulating layer which is a lower film by spin coating; and
  removing the solvent by post heat treatment and forming a quantum dot using cohesion of the nano particles.

18. The method of claim 14, wherein the gate electrode fills a space defined by the intercell insulating layer and the gate insulating layer.

19. The method of claim 14, further comprising, before forming the active region:
  forming a tunneling insulating layer on surfaces of the sacrificial layer and the intercell insulating layer exposed by the through hole.

20. The method of claim 19, wherein a thickness of the gate insulating layer exceeds that of the tunneling insulating layer.

* * * * *